United States Patent
Zhu

(10) Patent No.: US 8,842,396 B1
(45) Date of Patent: Sep. 23, 2014

(54) MAGNETIC SENSOR WITH DIFFERING STRIPE HEIGHTS

(71) Applicant: Seagate Technology LLC, Cupertino, CA (US)

(72) Inventor: Jianxin Zhu, Eagan, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/797,578

(22) Filed: Mar. 12, 2013

(51) Int. Cl.
  *G11B 5/39* (2006.01)
  *G11B 5/60* (2006.01)

(52) U.S. Cl.
  CPC .................................. *G11B 5/6082* (2013.01)
  USPC .................................................... 360/324.12

(58) Field of Classification Search
  CPC ..... G11B 5/3912; G11B 5/398; G11B 5/3932
  USPC ............. 360/324.11, 324.12, 319, 320, 235.4
  See application file for complete search history.

(56) References Cited

U.S. PATENT DOCUMENTS

| | | | |
|---|---|---|---|
| 6,667,862 B2 | 12/2003 | Zhu | |
| 7,436,638 B1 | 10/2008 | Pan | |
| 7,532,442 B2 | 5/2009 | Gill | |
| 7,869,165 B2 | 1/2011 | Miyauchi et al. | |
| 8,064,162 B2 | 11/2011 | Matsumoto et al. | |
| 8,149,546 B2 | 4/2012 | Ayukawa et al. | |
| 8,194,366 B1 | 6/2012 | Li et al. | |
| 8,369,048 B2 * | 2/2013 | Miyauchi et al. | 360/319 |
| 8,400,738 B2 * | 3/2013 | Covington et al. | 360/324.12 |
| 8,462,469 B1 * | 6/2013 | Kanaya et al. | 360/324.12 |
| 8,467,154 B2 * | 6/2013 | Covington et al. | 360/324.1 |
| 8,553,369 B2 * | 10/2013 | Song et al. | 360/324.12 |
| 8,582,250 B2 * | 11/2013 | Qiu et al. | 360/324.12 |
| 8,619,393 B2 * | 12/2013 | Stokes | 360/324 |
| 2005/0219773 A1 | 10/2005 | Li et al. | |
| 2009/0213502 A1 * | 8/2009 | Miyauchi et al. | 360/319 |
| 2010/0103563 A1 * | 4/2010 | Machita et al. | 360/316 |
| 2011/0026169 A1 * | 2/2011 | Gill et al. | 360/324.12 |
| 2013/0149559 A1 * | 6/2013 | Covington et al. | 428/816 |

\* cited by examiner

*Primary Examiner* — Angel Castro

(74) *Attorney, Agent, or Firm* — Hall Estill Attorneys at Law

(57) ABSTRACT

A magnetic sensor may be generally configured in accordance with various embodiments to have a magnetically responsive stack with first and second free layers and without a fixed magnetization. The first and second free layers can be tuned to have different stripe heights from an air bearing surface (ABS) and square rear surface features distal the ABS.

20 Claims, 4 Drawing Sheets

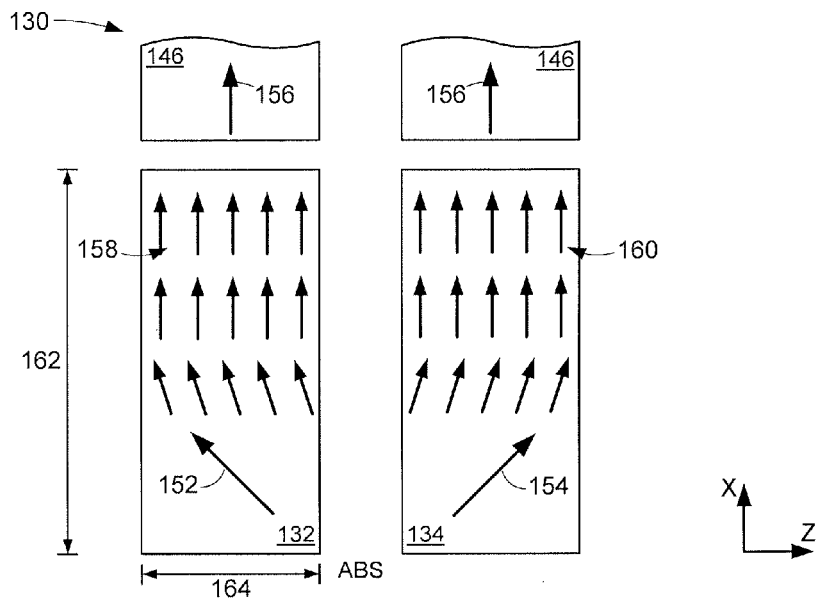
FIG. 2B
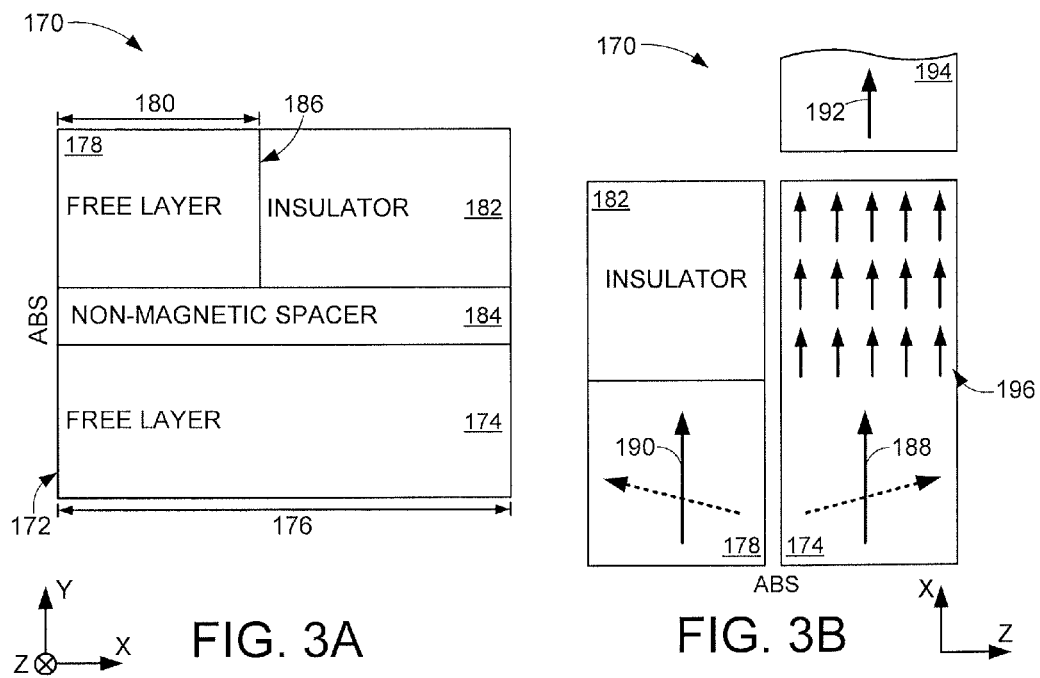
FIG. 3A
FIG. 3B

MAGNETIC SENSOR WITH DIFFERING STRIPE HEIGHTS

SUMMARY

Various embodiments are generally directed to a magnetic sensor capable of distinguishing between data bits.

In accordance with some embodiments, a magnetically responsive stack can be configured with first and second free layers and without a fixed magnetization. The first and second free layers may be tuned to have different stripe heights from an air bearing surface (ABS) and square rear surface features distal the ABS.

BRIEF DESCRIPTION OF THE DRAWINGS

FIGS. 2A and 2B respectively show cross-section and top view representations of a portion of an example magnetic element capable of being used in the data storage device of FIG. 1.

FIGS. 3A and 3B respectively display cross-section and top view representations of a portion of an example data reader tuned in accordance with various embodiments.

DETAILED DESCRIPTION

Advancement of magnetoresistive data sensors has reduced data access times while increasing data capacity. Data sensing laminations employing free magnetizations without a fixed, pinned reference structure can decrease the physical and magnetic size of a transducing element, but may also correspond to increased signal-to-noise ratio as magnetic domains are established at different portions of the sensing lamination. Reduction of free layer thickness in dual free layer sensing lamination can inadvertently couple and induce unstable local magnetizations that increase noise and degrade data sensing performance. Hence, reduction and elimination of inadvertent free layer coupling in dual free layer sensing lamination is a continued goal of the data storage industry.

With data sensing optimization in mind, a transducing element may be configured at least with a magnetically responsive stack that has first and second free layers and without a fixed magnetization and with differing stripe heights from an air bearing surface (ABS) and respective square rear surfaces distal to the ABS. The tuned stripe heights of the free layers can decrease coupling between the free layers in portions distal the ABS, which can reduce noise during operation and preserve signal amplitude by allowing free layer coupling proximal the ABS. The ability to tune the position and size of a biasing magnet distal the ABS can further stabilize the free layers to default magnetizations that provide a more consistent and stronger data signal.

Figure 1:
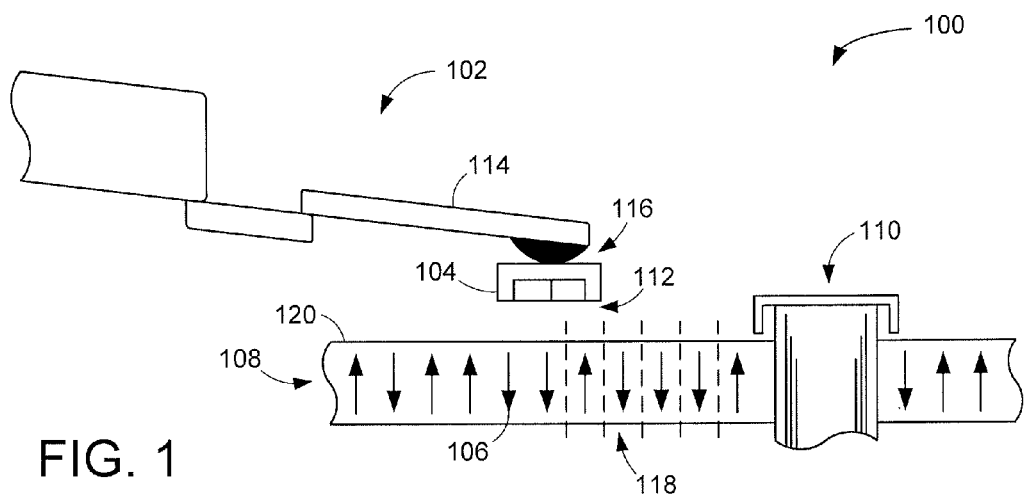
FIG. 1 is a block representation of a portion of an example data storage device in accordance with some embodiments.

While a data sensing lamination that employs free layers with tuned stripe heights can be practiced in an unlimited variety of data storage environments, FIG. 1 provides an example transducing portion 100 of a data storage device capable of utilizing a tuned data sensing lamination. The data transducing portion 100 is configured with an actuating assembly 102 that positions a transducing head 104 over programmed data bits 106 present on a magnetic storage media 108 that is attached to, and rotates about, a spindle motor 110 to produce an air bearing surface (ABS) 112. The speed in which the spindle motor 110 rotates allows a slider portion 114 of the actuating assembly 102 to fly on the ABS 112 to position a head gimbal assembly (HGA) 116, which includes the transducing head 104, over a desired portion of the media 108.

The transducing head 104 may be constructed with one or more transducing elements, such as a magnetic writer and magnetically responsive reader, which operate to program data to and read data bits 106 from the storage media 108, respectively. In this way, controlled motion of the actuating assembly 102 and spindle motor 110 can modulate the position of the transducing head 104 both laterally along predetermined data tracks 118 defined on the storage media surface 120 and vertically as measured perpendicularly to the media surface 120 across the ABS 112 to selectively write, read, and rewrite data.

Figure 2A:
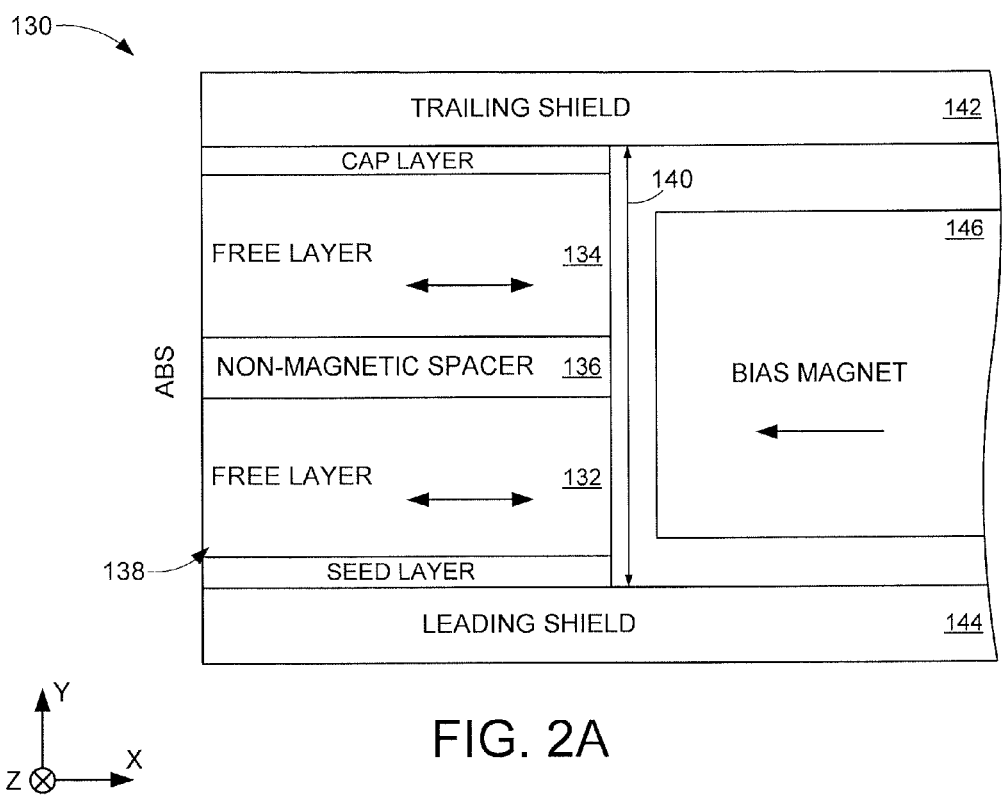

FIGS. 2A and 2B respectively display cross-section and top views of portions of an example transducing element 130 capable of being utilized in the data storage device of FIG. 1. The transducing element 130 may be characterized as a tri-layer sensing as first 132 and second 134 magnetically free layers contact opposite sides of a non-magnetic spacer 136 on an air bearing surface (ABS) as part of a magnetic stack 138. Configuring the transducing element 130 with magnetically free layers and no fixed magnetization reference structure, such as in an abutted junction lamination, allows the shield-to-shield spacing 140 between the trailing 142 and leading 144 shields to be decreased. Such a lack of a fixed magnetization in the magnetic stack 138 can, however, correspond to unpredictable free layer 132 and 134 response to data bits across the ABS. Placement of a bias magnet 146 adjacent to and separated from each free layer 132 and 134 can induce a default magnetization that provides consistent and reliable magnetic response to encountered data bits.

It should be noted that the term "stack" is an unlimited term within this disclosure that can be one or more vertically and horizontally aligned layers, constructed of magnetic and non-magnetic material that are capable of magnetic reading and writing. Throughout the present application, the term "stack" will be understood to mean a component that is constructed to respond to external data bits to provide access to external data bits in any operational environment. For example, but not in any way limiting, a magnetic stack may be a data read or write configuration that can differentiate between a plurality of data bits.

FIG. 2B provides a top view of the first 132 and second 134 free layers each biased to default magnetizations 152 and 154 for a zero external magnetic field that are substantially orthogonal and set to predetermined strength by magnetostatic coupling and interlayer coupling between the first 132 and second 134 free layers. The magnetostatic coupling relates to the shape anisotropy of the magnetic materials and depends on the aspect ratio of top and bottom free layers respectfully, as well as their materials properties like saturation magnetization and stress, as well as spacer thickness. Interlayer coupling strength includes Neel (interfacial) coupling and possible RKKY (interlayer) coupling. Interlayer coupling energy can have range from $-3 \times 10{-4}$ J/m2 to $3 \times 10{-4}$ J/m2, as negative values means antiferromagnetic "antiparallel" coupling and positive values means ferromagnetic "parallel" coupling.

The predetermined orientation and strength of the default magnetizations 152 and 154 can allow the free layers to respectively rotate, or scissor, in response to encountered data bits to produce a data signal. The translation of the bias magnetization 156 to the ABS is illustrated by biasing magnetizations 158 and 160 in each free layer 132 and 134, distal the ABS. With increased stripe heights 162, decreased widths 164, and reduced distances between the free layers 132 and 134, the biasing magnetizations 158 and 160 can couple together along the entirety of the stripe height 162, which can degrade magnetic performance as magnetic noise is produced and the biasing magnetizations 158 and 160 dampen the default magnetization's 152 and 154 reaction to magnetic fields corresponding to data bits. Such dampened magnetizations can combine with the minimization of transducing element components, like free layers 132 and 134, that has reduced the data signal amplitude compared to physically large shield-to-shield spacing 140 transducing elements, to result in unreliable data reading, higher error rates, and increased data storage latency.

FIGS. 3A and 3B respectively show cross-section and top views of portions of an example transducing element 170 constructed in accordance with some embodiments to eliminate inadvertent magnetic stack 172 coupling that can degrade magnetic performance. As displayed in FIG. 3A, the magnetic stack 172 has a first free layer 174 continuously extending a first stripe height 176 from the ABS and a second free layer 178 extending a different, shorter second stripe height 180 from the ABS. The difference in stripe heights 176 and 180 is filled by a non-magnetic insulating layer 182 that contacts both the second free layer 178 and non-magnetic spacer 184 and defines the square rear surface 186 of the second free layer 178 that uniformly extends parallel to the ABS. Configuring both free layers 174 and 178 with square rear surfaces, distal the ABS can allow for a more efficient production of default magnetizations 188 and 190 via a bias magnetization 192 from a bias magnet 194, as displayed in FIG. 3B.

FIG. 3B further illustrates how the stripe heights 176 and 180 can be tuned to provide optimized magnetic performance by configuring the size and position of the insulating layer 182 to allow the biasing magnetizations 196 to freely rotate. The ability to move may allow the biasing magnetizations 196 to induce the predetermined orientation and strength of the default magnetizations 188 and 190 without dampening the response of the default magnetizations 188 and 190 to encountered data bits, as illustrated by the solid magnetizations corresponding to a positive direction magnetic field and the segmented magnetizations corresponding to a negative direction external field.

That is, bias magnetization 192 from the rear bias magnet 194 can be translated accurately and precisely by the biasing magnetizations 196 along the stripe height 176 of the first free layer 174 to induce the default magnetization 188 without inhibiting magnetic response of the default magnetization 188 to external data bits. The capability to fully respond to data bits without added magnetic noise and restriction can preserve data signal amplitude while reducing data error rates. In other words, the thermal magnetic noise which is high in the parallel "P-" state region is thus screened out from readback signal.

The configuration of the insulating layer 182 can effectively reduce and eliminate the influence of the rear bias magnet 194 on the second free layer 178. Such lack of bias magnetization imposed on the second free layer 178 does not eliminate the ability to provide a default magnetization 192 that has predetermined orientation and strength via shape anisotropy, deposition techniques like oblique incidence angle sputtering, and material selection. The tuned configuration of the insulating layer 182 also does not inhibit the coupling of the free layers 174 and 178 proximal the ABS to produce a measurable magnetoresistive data signal. Additionally, the tuned construction of the insulating layer 182 can reduce the physical and magnetic size of the magnetic stack 172 as the free layers 174 and 178 can be thinner and closer together without fear of noise and inadvertent coupling.

In dual-free layer reader design, using long sensor stripe heights, such as the aspect ratio of greater than 1 illustrated by layers 174 and 178, can provide good shape anisotropy energy to help stabilize the transducing element 170. However, only the portion of the stack 172 close to ABS is exposed to a media field. The back portion of the stripe height normally does not sense the field and the local magnetization of back portions of stripe heights can remain parallel to the stripe height direction throughout readback processes, which corresponds to the back portion of stripe height in the both free layers not contributing to a readback signal. Additionally, thermal magnetic noise in a parallel "P-" state of magnetization can be a source of noise via tunneling between top free layer and bottom free layer across the spacer.

A long stripe height of free layer 174 compared to free layer 178 can provide adequate shape anisotropy while the shorter stripe height free layer 178 can contribute only a high signal, low noise portion of the sensor into the readback signal. Also, the aspect ratio, which may be characterized as stripe height versus reader width, of the longer stripe height free layer 174 can provide a cross-track shape anisotropy which further stabilizes the reader and can be used to adjust reader bias point and optimize readback signal symmetry.

Figure 4:
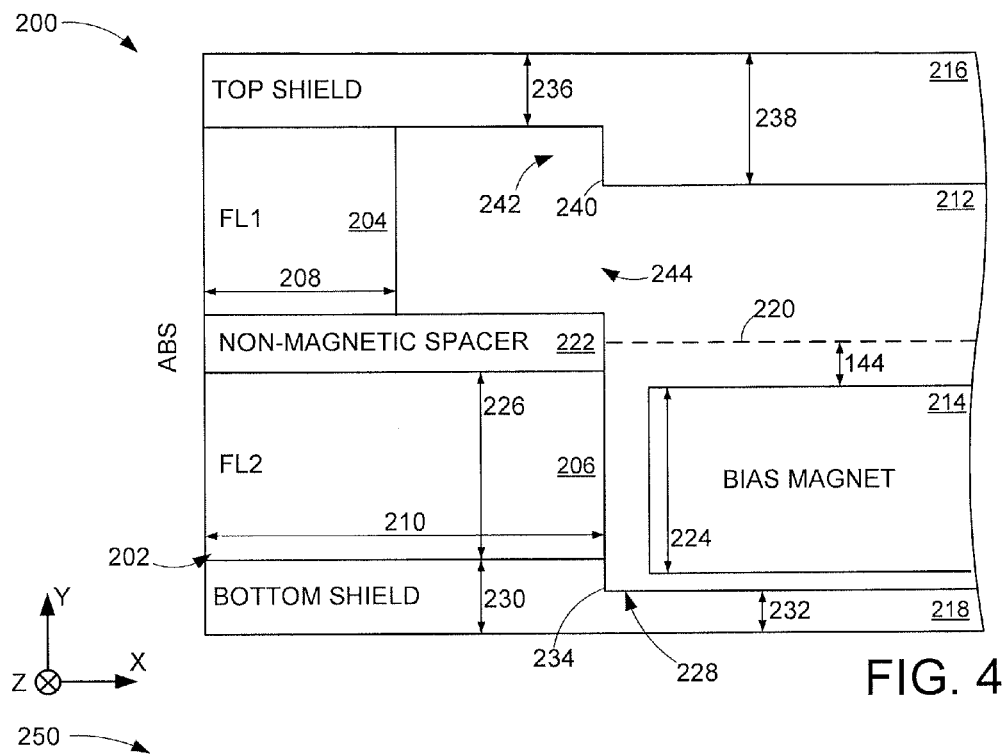
FIG. 4 illustrates a top view block representation of an example magnetic element configured in accordance with some embodiments.

FIG. 4 provides a cross-section view of a portion of an example data sensor 200 configured in accordance with various embodiments to optimize the magnetic performance of a magnetic stack 202 employing free layers 204 and 206 of different stripe heights 208 and 210. The efficient isolation of the second free layer 204 may be tuned with the size and position of the insulating layer 212, as shown in FIGS. 3A and 3B, but may also be tuned by position of the rear bias magnet 214 and configuration of the top 216 and bottom 218 shields. By positioning the bias magnet 214 offset exclusively to one side of a centerline 220 that extends perpendicular to the ABS through the non-magnetic spacer 222 of the magnetic stack 202, the first free layer 204 can more effectively be isolated from bias magnetization from the bias magnet 214.

The rear bias magnet 214 may also be tuned for thickness 224 that may be the same, lower than, or greater than the thickness 226 of the second free layer 206 to allow the bias magnet 214 to extend into a bevel region 228 of the bottom shield 218. The bevel region 228 can be defined by a reduction in bottom shield 218 thickness from an ABS thickness 230 proximal the ABS to a reduced thickness 232 distal the ABS. The bevel region 228 can be configured with a bevel surface 234 that is linear, curvilinear, and angled to optimize interaction between the bias magnet 214 and the second free layer 204. That is, the bevel region 228 can be tuned for shape and size to allow the bias magnet 214 to extend into the bottom shield 218 beyond the free layer thickness 226 along a plane parallel to the ABS and Y axis.

Shield tuning capabilities are not exclusive to the bottom shield 218 as the top shield 216 can, either independently or collectively, be shaped to optimize magnetic stack 202 performance, As shown, a reduced ABS thickness 236 proximal the ABS can transition to an increased thickness 238 distal the ABS via a bevel surface 240 that defines a bevel region 242 that creates a throat region 244 between the non-magnetic spacer 222 and the top shield 216. Tuning the size and shape of the bevel region 242 through manipulation of the bevel surface 240 can complement the offset position of the rear bias magnet 214 in relation to the centerline 220 to minimize the bias magnetization reaching the first free layer 204. As such, the tuned configuration of the throat region 244 can eliminate the production of noise and localize free layer coupling to portions of the magnetic stack 202 proximal the ABS, which can optimize data sensor 200 performance.

Figure 5:
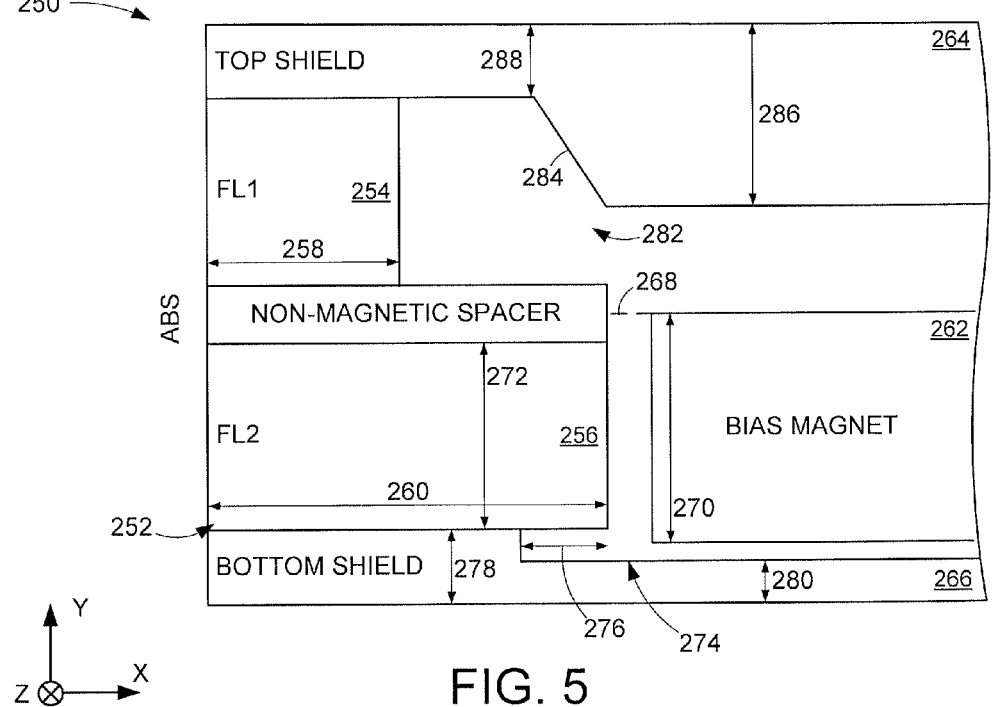
FIG. 5 shows a cross-section of an example data reader constructed in accordance with various embodiments.

FIG. 5 displays a cross-section of another example data sensor 250 constructed in accordance with some embodiments to provide optimized magnetic performance in reduced form factor, high data bit density data storage devices. The data sensor 250 has a magnetic stack 252 characterized by a lack of any fixed magnetization and dual free layers 254 and 256. The first free layer 254 is configured with a stripe height 258 that is less than half the stripe height 260 of the second free layer 256 to prevent noise and inadvertent coupling between the free layers 254 and 256 distal the ABS. Each free layer 254 and 256 are biased to a default magnetization by a bias magnet 262 positioned between top 264 and bottom 266 shields and offset exclusively to one side of a stack centerline 268.

The bias magnet 262 is tuned to have a greater thickness 270 along the Y axis parallel to the ABS than the thickness 272 of the second free layer 256. Tuning the bottom shield 266 with a bevel region 274 allows the bias magnet thickness 270 to be greater than the free layer thickness 272 while remaining on one side of the stack centerline 268. In the non-exclusive embodiment shown in FIG. 5, the bevel region 274 extends within the areal extent of the magnetic stack 252 a predetermined distance 276 so that the increased thickness 278 portion of the bottom shield 266 has a smaller stripe height than the stripe height 260 of the second free layer 256. Tuning the distance 276 in which the bevel region 274 extends allows more bias magnetization from the bias magnet 262 to influence the second free layer 256 than if the reduced thickness 280 portion of the bottom shield 266 begins at the stripe height 260 of the second free layer 256.

The increased size of the bias magnet 262 allowed by the bevel region 274 can produce enough bias magnetization to influence the first free layer 254. To ensure minimal magnetic noise and the default magnetization of the first free layer 254, the top shield 264 can be tuned to produce a throat region 282 that blocks the bias magnetization and allows the shape anisotropy and material configuration of the first free layer 254 to establish its default magnetization. Tuning the bevel surface 284 to have and angled orientation with respect to the ABS and a length that brings the greater thickness 286 portion of the top shield 264 closer to ABS than the stripe height 260 of the second free layer 256 can increase the protection of the first free layer 254 from bias magnetizations. The throat region 282 may further be configured by tuning the thickness 288 and stripe height of the reduced thickness portion of the top shield 264, which can position the bevel surface 284 close enough to the first free layer 254 to ensure magnetic protection and far enough away to prevent inadvertent shunting of magnetization between the free layer 254 and top shield 264.

Figures 6A, 6B:
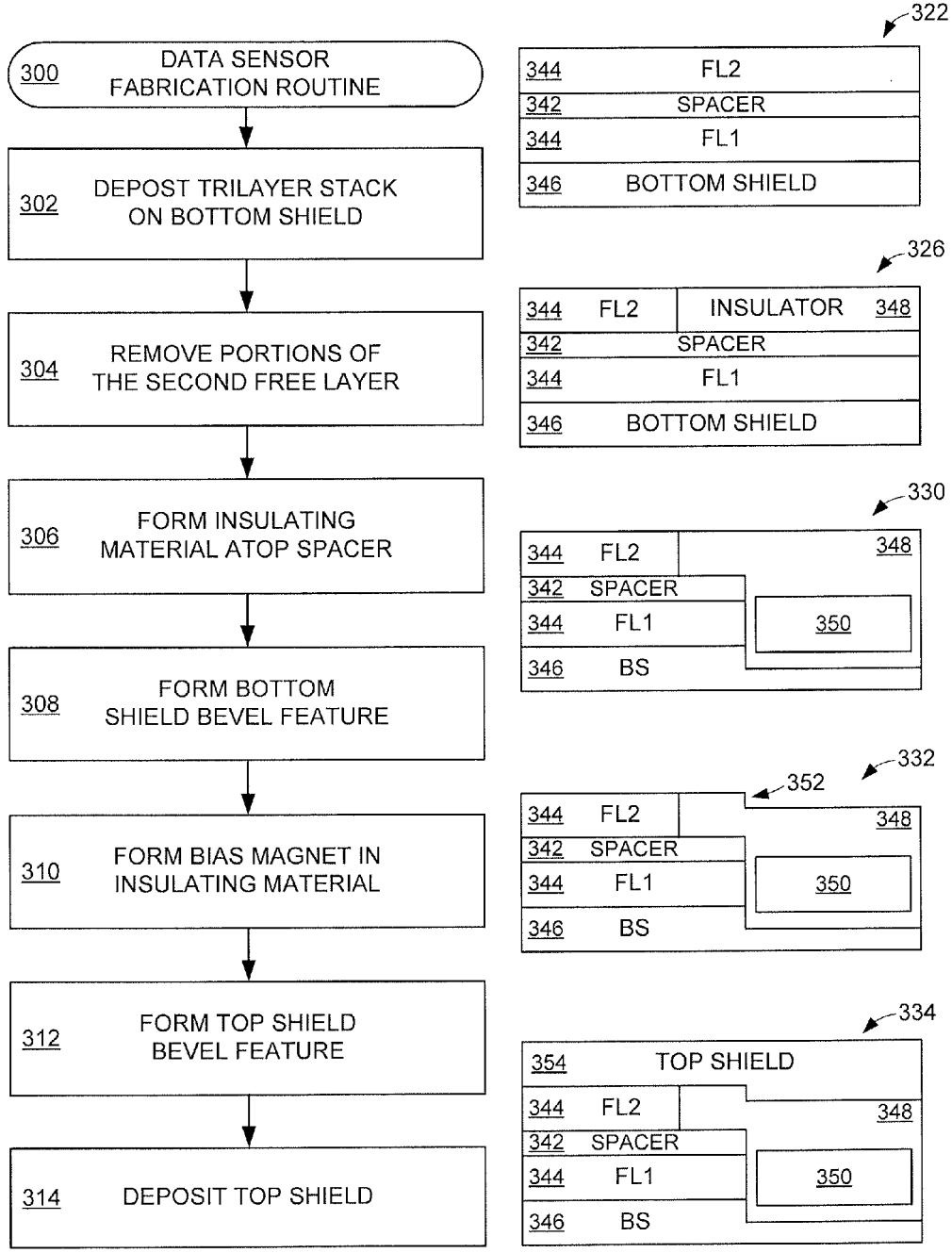
FIG. 6A provides a flowchart of a data reader fabrication routine carried out in accordance with various embodiments.
FIG. 6B illustrates an example magnetic sensor fabrication routine.

Through the tuned construction of the top 264 and bottom 266 shields, the default magnetizations of the first 254 and second 256 free layers can be established and allowed to freely rotate in response to encountered data bits. The tuned configuration of the rear bias magnet 262 further allows the default magnetizations to be induced without producing magnetic noise or inadvertent coupling that can degrade magnetic performance. Such tuned construction may be facilitated in a variety of non-limiting manners. FIGS. 6A and 6B respectively illustrate an example magnetic sensor fabrication routine 300 carried out in accordance with some embodiments. In the embodiment shown in FIG. 6A, step 302 begins by depositing a trilayer stack lamination atop a bottom shield. The example sensor lamination 322 of FIG. 6B corresponds to step 302 and displays how a non-magnetic spacer 342 can be disposed between free layers 344 on top of a bottom shield 346.

Step 304 of FIG. 6A proceeds to remove portions of the second free layer to define a reduced stripe height that is filled in step 306 by insulating material, as shown by sensor lamination 324 of FIG. 6B where the insulator 348 continuously bridges the difference in stripe heights between the free layers 344. Next in step 308 of FIG. 6A, a bottom shield bevel feature is constructed by patterning and removing portions of the sensor stack distal an ABS. As shown in FIGS. 4 and 5, the bottom shield bevel feature can be tuned to a variety of different shapes, positions, and sizes defined by at least two different bottom shield thicknesses. A bias magnet is then formed in step 310 in accordance with a tuned position, such as offset distance from a stack centerline, and size, such as a thickness that is greater than the thickness of the longer free layer.

Sensor lamination 330 of FIG. 6B corresponds to the successive execution of steps 308 and 310 of routine 300 and shows how the bias magnet 350 can be nested in the bevel region of the bottom shield 346 to be proximal only one of the free layers 344. In some embodiments, a top shield is constructed with a uniform thickness throughout its stripe height, such as shield 142 of FIG. 2, which can provide simple fabrication and skip routine 300 to step 314. However, the tuned configuration of a throat region corresponds with an additional formation step 312 where, as shown in sensor lamination 332, a bevel feature 352 is defined by removal of portions of the insulating material 348.

Subsequent to the formation of the throat region with step 312 and bevel feature 352, routine 300 then conducts step 314 to deposit the top shield atop the second free layer and insulating material 348, as displayed by sensor lamination 334. It should be noted that the various steps of routine 300 are not required or limited. For instance, additional annealing operations may be conducted on some or all of the sensor lamination to set predetermined anisotropy, magnetization orientation, and magnetization strength.

With a tuned magnetic sensor design and construction, magnetic noise and inadvertent coupling can be reduced and eliminated to allow optimized magnetic stack performance despite minimal size and tolerances. The ability to configure the free layers of the magnetic stack with square rear surfaces and differing stripe heights can eliminate the production of noise and allow the longer free layer to freely rotate in response to encountered data bits while shape anisotropy and material selection sets a default magnetization in the shorter free layer. Moreover, the tuned configuration of the rear bias magnet and shields allows bias magnetization to be tailored to the longer free layer with an increased size and strength thanks to the bevel regions of each magnetic shield.

While the embodiments herein have been directed to magnetic sensing, it will be appreciated that the technology described above can readily be utilized in any number of other applications, including data writing. It is to be understood that even though numerous characteristics of various embodiments of the present disclosure have been set forth in the foregoing description, together with details of the structure and function of various embodiments, this detailed description is illustrative only, and changes may be made in detail, especially in matters of structure and arrangements of parts within the principles of the present technology to the full extent indicated by the broad general meaning of the terms in which the appended claims are expressed.

What is claimed is:

1. A data sensor comprising a magnetically responsive stack comprising first and second free layers and without a fixed magnetization, the first free layer having a lesser stripe height from an air bearing surface (ABS) than the second free layer, the first and second free layers each having square rear surface features distal the ABS, a bias magnet separated from the magnetically responsive stack and aligned with the second free layer so that no portion of the bias magnet extends beyond the centerline.

2. The data sensor of claim 1, wherein the square rear surface features are each uniformly parallel to the ABS.

3. The data sensor of claim 1, wherein only one free layer is set to a default magnetization by the rear bias magnet.

4. The data sensor of claim 3, wherein the default magnetization is set only by the rear bias magnet.

5. An apparatus comprising:
a magnetically responsive stack comprising first and second free layers and without a fixed magnetization, the first free layer having a lesser stripe height from an air bearing surface (ABS) than the second free layer, the first and second free layers each having square rear surface features distal the ABS; and
a rear bias magnet separated from the magnetically responsive stack and positioned offset from a centerline extending perpendicular to the ABS through a midpoint of the magnetically responsive stack, the rear bias magnet positioned on a side of the centerline proximal the second free layer and distal the first free layer so that no portion of the bias magnet extends beyond the centerline.

6. The apparatus of claim 5, wherein the midpoint corresponds with a non-magnetic spacer between the free layers.

7. The apparatus of claim 5, wherein the rear bias magnet is positioned only on one side of the centerline.

8. The apparatus of claim 5, wherein the rear bias magnet is adjacent to and separated from the second free layer, distal the ABS.

9. The apparatus of claim 8, wherein the second free layer has a greater stripe height than the first free layer.

10. The apparatus of claim 5, wherein the second free layer is disposed between the rear bias magnet and the ABS.

11. The apparatus of claim 10, wherein no portion of the rear bias magnet crosses the centerline.

12. A transducing element comprising:
a magnetically responsive stack comprising first and second free layers and without a fixed magnetization, the first free layer having a lesser stripe height from an air bearing surface (ABS) than the second free layer, the first and second free layers each having square rear surface features distal the ABS; and
a rear bias magnet separated from the magnetically responsive stack and positioned offset from a centerline extending perpendicular to the ABS through a midpoint of the magnetically responsive stack, the rear bias magnet positioned in a bevel region of a magnetic shield on a side of the centerline proximal the second free layer and distal the first free layer, the rear bias magnet aligned with the second free layer so that no portion of the bias magnet extends beyond the centerline.

13. The transducing element of claim 12, wherein the first bevel region is defined by a change in thickness of a bottom shield parallel to the ABS.

14. The transducing element of claim 13, wherein the first bevel region decreases the thickness of the bottom shield.

15. The transducing element of claim 12, wherein the first bevel region transitions a thickness of a bottom shield at a rear surface of the second free layer.

16. The transducing element of claim 12, wherein the first bevel region transitions a thickness of a bottom shield at a position between the stripe heights of the first and second free layers.

17. The transducing element of claim 12, wherein a second bevel region forms a throat region between the top shield and a non-magnetic spacer of the magnetically responsive stack, the throat region corresponding to an increased top shield thickness.

18. The transducing element of claim 12, wherein a top shield has a uniform thickness along a shield stripe height, the shield stripe height being greater than the stripe heights of either free layer.

19. The transducing element of claim 12, wherein the rear bias magnet has a thickness that extends from the centerline beyond an areal extent of the second free layer into the first bevel region defined by a reduced thickness in a bottom shield.

20. The transducing element of claim 12, wherein the difference between stripe heights of the free layers is filled with insulating material.

* * * * *